(12) United States Patent
Kim

(10) Patent No.: US 7,642,203 B2
(45) Date of Patent: Jan. 5, 2010

(54) PASSIVATION LAYER FOR SEMICONDUCTOR DEVICE AND MANUFACTURING METHOD THEREOF

(75) Inventor: Seung Hyun Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 414 days.

(21) Appl. No.: 11/609,897

(22) Filed: Dec. 12, 2006

(65) Prior Publication Data

US 2007/0148987 A1    Jun. 28, 2007

(30) Foreign Application Priority Data

Dec. 28, 2005   (KR) .................... 10-2005-01311499

(51) Int. Cl.
*H01L 21/31* (2006.01)
(52) U.S. Cl. .................. 438/786; 257/637; 257/639; 257/E21.267
(58) Field of Classification Search .................. 438/786; 257/E21.267, 637, 639
See application file for complete search history.

(56) References Cited

U.S. PATENT DOCUMENTS

| 5,962,920 A * | 10/1999 | Ueda et al. .................. 257/760 |
| 6,597,046 B1 * | 7/2003 | Chau et al. .................. 257/411 |
| 2004/0175961 A1 * | 9/2004 | Olsen .......................... 438/786 |
| 2005/0186765 A1 * | 8/2005 | Ma et al. ..................... 438/532 |

FOREIGN PATENT DOCUMENTS

KR    10-0395029    8/2003

* cited by examiner

*Primary Examiner*—Trung Dang
(74) *Attorney, Agent, or Firm*—Sherr & Vaughn, PLLC

(57) ABSTRACT

Embodiments relate to a passivation layer for a semiconductor device that may be formed in a substrate having a plurality of semiconductor devices. The passivation layer may includes a first passivation layer, a second passivation layer, and a third passivation layer, and the passivation layer may have a laminated triple layer structure.

19 Claims, 3 Drawing Sheets

US 7,642,203 B2

PASSIVATION LAYER FOR SEMICONDUCTOR DEVICE AND MANUFACTURING METHOD THEREOF

The present application claims priority under 35 U.S.C. 119 and 35 U.S.C. 365 to Korean Patent Application No. 10-2005-0131499 (filed on Dec. 28, 2005), which is hereby incorporated by reference in its entirety.

BACKGROUND

A manufacturing process of a semiconductor device may include manufacturing a series of semiconductor devices that make up a semiconductor apparatus. An assembly process may thereafter be performed.

Before such an assembly process is performed, a passivation layer may be formed, which may protect a semiconductor device from static electricity, moisture, impact, etc.

For example, such a passivation layer may play a role in protecting a semiconductor device from moisture, ultraviolet radiation from the sun, impact forces, pressure, and so forth.

A passivation layer may have a structure as illustrated in FIG. 1.

Referring to FIG. 1, a passivation layer may have a dual layer structure that may include lower passivation layer 120, for example made from silicon oxide, that may be formed on metal wiring 110. A passivation layer may also include upper passivation layer 130, for example made from silicon nitride. Metal wiring 110 may interconnect semiconductor devices.

An annealing process may be performed after laminating a passivation layer. During an annealing process, fumes (e.g. gases) may occur from the lower layer of the passivation layer. In a dual layer passivation layer structure, a passivation layer may not be able to bear the pressure of the fume gas. In this situation, the silicon nitride layer (upper layer 130) may be partially removed from the silicon oxide layer (lower layer 120). Therefore, failure 180 may occur as illustrated in FIG. 1.

Hence, a general passivation layer having a dual layer structure may include a silicon oxide layer and a silicon nitride layer. In the passivation layer with the dual layer structure, upper layer 130 and lower layer 120 may have a large surface stress difference therebetween and may have poor adhesive strength therebetween. Therefore, upper passivation layer 130 may become partially removed from lower passivation layer 120, for example in a high temperature process such as an annealing process. Moreover, if upper passivation layer 130 is damaged, a semiconductor device may be damaged by chemical materials in a subsequent packaging process.

A failure of the passivation layer may cause a semiconductor device to be damaged by chemical materials used in a subsequent assembly process, and may cause other failures to occur, for example failures in a wire bonding process.

SUMMARY

Embodiments relate to a semiconductor device and a method for manufacturing a semiconductor device.

Embodiments relate to a passivation layer that may prevent a semiconductor device from being damaged in an assembly process, and a manufacturing method thereof.

In embodiments, a passivation layer for a semiconductor device formed in a substrate having a plurality of semiconductor devices therein may include a first passivation layer, a second passivation layer, and a third passivation layer, wherein the passivation layer has a laminated triple layer structure. Hence, a passivation layer may have a plurality of passivation layers, wherein the passivation layers are laminated in a triple layer structure.

In embodiments, a method for manufacturing a passivation layer for a semiconductor device may include laminating a first passivation layer on a substrate having a plurality of semiconductor devices therein, laminating a second passivation layer on the first passivation layer, implanting an ion into a boundary surface between the first passivation layer and the second passivation layer, and forming a third passivation layer between the first passivation layer and the second passivation layer by performing an annealing process.

DETAILED DESCRIPTION OF EMBODIMENTS

Figure 1:
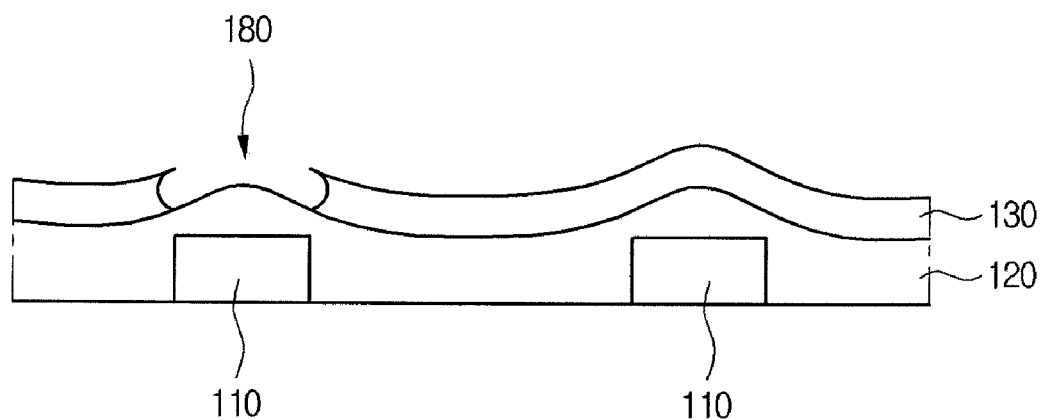
FIG. 1 is example drawing illustrating a structure of a passivation layer.
Figure 2:
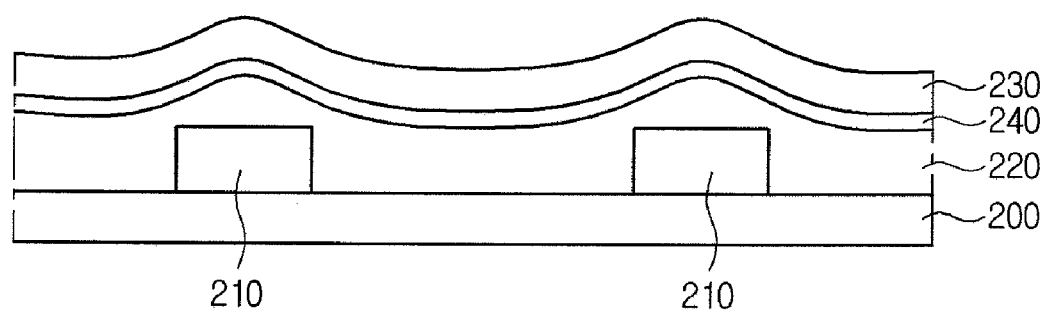
FIG. 2 is an example drawing illustrating a laminated structure of a passivation layer for a semiconductor device according to embodiments.

Referring to FIG. 2, a passivation layer may have a triple layer structure. According to embodiments, first passivation layer 220, third passivation layer 240, and second passivation layer 230 may be sequentially laminated on substrate 200. The substrate 200 may have a plurality of semiconductor devices 210 therein.

In embodiments, first passivation layer 220 may be a silicon oxide layer. In embodiments, third passivation layer 240 may be a silicon oxide-nitride layer. In embodiments, second passivation layer 230 may be a silicon nitride layer.

In embodiments, a passivation layer for a semiconductor device may have a triple layer structure including different components. Specifically, third passivation layer 240, that may be a silicon oxide-nitride layer, may be formed.

According to embodiments, third passivation layer 240 may be formed between first passivation layer 220, which may be made from a silicon oxide layer, and second passivation layer 230, which may be made from a silicon nitride layer. Third passivation layer 240 may be made from a silicon oxide-nitride layer.

Third passivation layer 240 may function as a buffer and may alleviate a surface stress difference between second passivation layer 230 and first passivation layer 220. Third passivation layer 240 may compensate for adhesive strength between the upper passivation layer and the lower passivation layer. That is, third passivation layer 240 may provide additional adhesive strength between upper passivation layer 230 and lower passivation layer 220.

According to embodiments, a passivation layer for a semiconductor may prevent an upper passivation layer of the passivation layer from being damaged, removed, or partially removed from a lower passivation layer. Accordingly the semiconductor device may be better protected during a subsequent process, such as a manufacturing process.

FIGS. 3 to 7 are example drawings illustrating a method for manufacturing a passivation layer for a semiconductor device according to embodiments.

Figure 3:
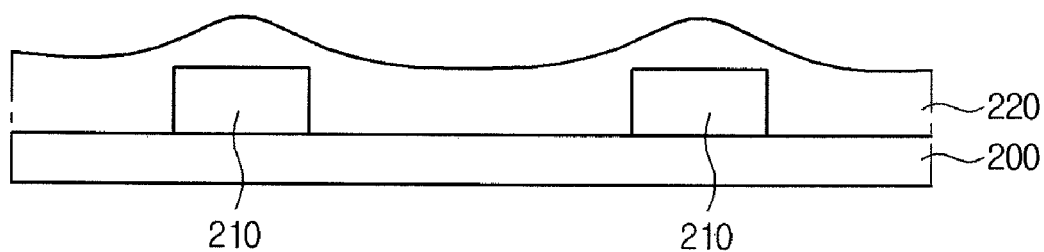
FIGS. 3 to 7 are example drawings illustrating a method for manufacturing a passivation layer for a semiconductor device according to embodiments.

Referring to FIG. 3, first passivation layer 220 may be laminated on substrate 200. Substrate 200 may have a plurality of semiconductor devices 210 formed thereon. In embodiments, first passivation layer 220 may be made from a silicon oxide layer.

Figure 4:
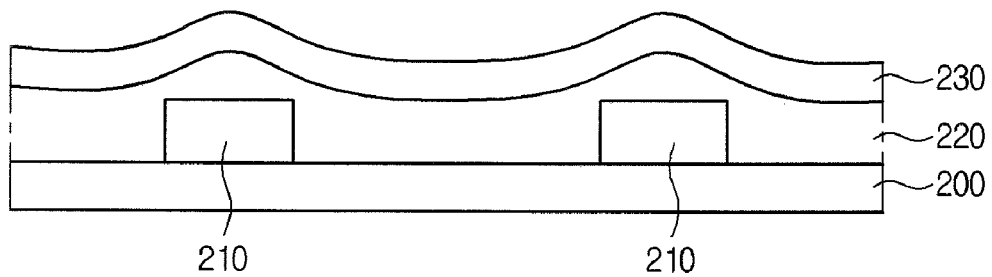

Referring to FIG. 4, second passivation layer 230 may be laminated on first passivation layer 220. In embodiments, second passivation layer 230 may be made from a silicon nitride layer.

Figure 5:
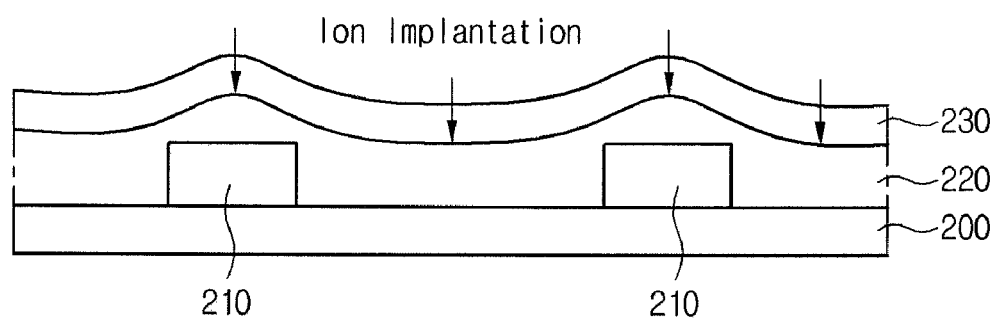

Referring to FIG. 5, an ion implantation process may be performed, and may implant impurities into the interface between second passivation layer 230 and first passivation layer 220.

In embodiments, the implanted ion may be oxygen or an oxygen-based impurity. However, the implanted ion may use any ion capable of forming a silicon oxide-nitride layer, for example by chemically reacting with the silicon nitride layer constituting second passivation layer 230.

Figure 6:
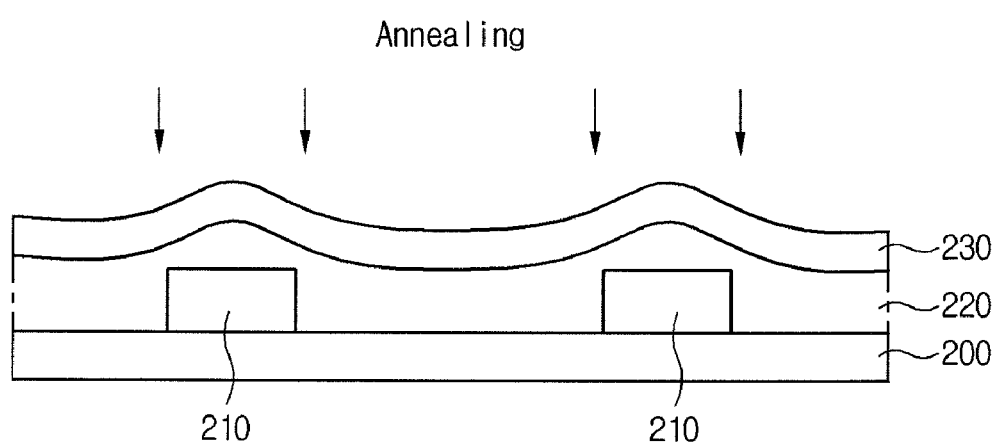
Figure 7:
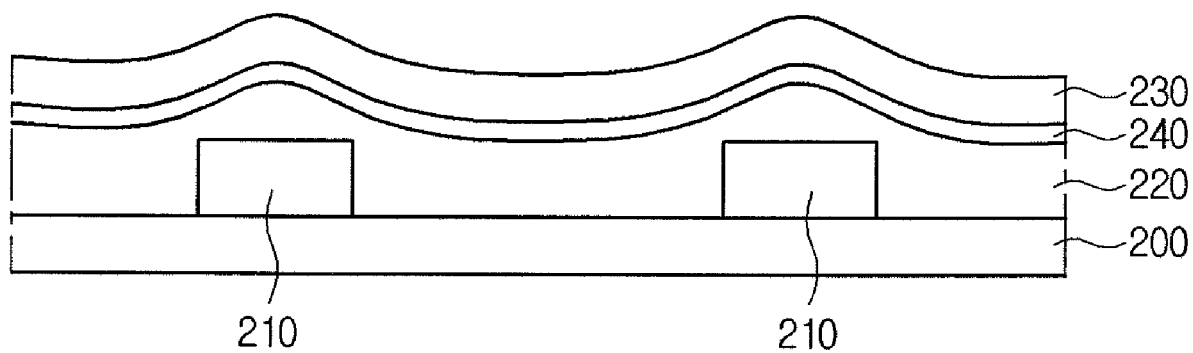

Referring to FIG. 6, second passivation layer 230 may have ions implanted in a lower portion thereof. Second passivation layer 230 may then be annealed. According to embodiments, third passivation layer 240 may thereby be formed under second passivation layer 230, as illustrated in FIG. 7.

That is, the annealing process may be performed to generate the interface between second passivation layer 230 and first passivation layer 220.

The process for annealing second passivation layer 230 may be performed in a temperature range of approximately 200 to 450° C., and at a pressure of several Torr to atmospheric pressure (approximately 760 Torr). In the annealing process, $N_2$ or $H_2$ gas may be used.

In embodiments, third passivation layer 240 may be formed by annealing second passivation layer 230. Third passivation layer 240 may have various thicknesses depending on certain variables, such as a temperature and reaction time of the annealing process. Specifically, if the temperature or reaction time of the annealing process increases, it may be possible to increase a thickness of third passivation layer 240.

According to embodiments, third passivation layer 240, which may be made from the silicon oxide-nitride layer, may be formed between first passivation layer 220 (for example, made from the silicon oxide layer) and second passivation layer 230 (for example, made from the silicon nitride layer). It may accordingly be possible to alleviate a surface stress difference between second passivation layer 230 and first passivation layer 220. It may also be possible to increase an adhesive strength between the upper passivation layer 230 and the lower passivation layer 220.

Consequently, according to embodiments, it may be possible to effectively prevent second (upper) passivation layer 230 from being removed or partially removed from first (lower) passivation layer 220. A semiconductor device may thereby be protected during a subsequent process.

Further, according to embodiments, ions may be implanted between second (upper) passivation layer 230 and first (lower) passivation layer 220, and then annealed. Third passivation layer 240 may thereby be formed. Thus, ions may be implanted into the second layer 230 and the annealing process may form the third layer 240.

In embodiments, since an amount of an implanted ion may be adjusted, it may be possible to adjust a thickness of the formed third passivation layer 240.

Third passivation layer 240 may be formed only in a portion of passivation layer, for example only partially covering a semiconductor device according to the characteristics of the semiconductor device formed in the substrate. A mask may be used to implant to ions only in a desired position. Third passivation layer 240 may thus be formed only in a desired position.

Moreover, third passivation layer 240 may be formed by a deposition process. Third passivation layer 240 may be formed through ion implantation and annealing processes. Accordingly it may be possible to easily adjust a thickness or position of third passivation layer 240.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A passivation layer comprising:
 a first passivation layer;
 a second passivation layer; and
 a third passivation layer,
 wherein the first, second, and third passivation layer form a laminated triple layer structure,
 wherein the third passivation layer is formed by implanting ions in the second passivation layer and performing an annealing process, wherein said implanting ions and said performing an annealing process are two separate processes.

2. The passivation layer of claim 1, wherein the third passivation layer comprises a silicon oxide-nitride layer.

3. The passivation layer of claim 2, the first passivation layer comprises a silicon oxide layer.

4. The passivation layer of claim 2, wherein the second passivation layer comprises a silicon nitride layer.

5. The passivation layer of claim 1, wherein the first passivation layer comprises a silicon oxide layer, the second passivation layer comprises a silicon nitride layer, and the third passivation layer comprises a silicon oxide-nitride layer.

6. The passivation layer of claim 1, wherein the first passivation layer comprises a first material having first characteristics, the second passivation layer comprises a second material having second characteristics, and the third passivation layer comprises a third material having the first and second characteristics.

7. The passivation layer of claim 6, wherein the first passivation layer is formed on a semiconductor substrate.

8. A method comprising:
 providing a first passivation layer on a substrate;
 providing a second passivation layer on the first passivation layer;
 implanting an ion into a boundary surface between the first passivation layer and the second passivation layer; and
 forming a third passivation layer between the first passivation layer and the second passivation layer by performing an annealing process, wherein said implanting an ion and said performing an annealing process are two separate processes.

9. The method of claim 8, wherein a plurality of semiconductor devices are formed on the substrate.

10. The method of claim 8, wherein the annealing process is performed to generate an interface between the first passivation layer and the second passivation layer.

11. The method of claim 8, wherein the ion comprises at least one of oxygen and an oxygen-based impurity.

12. The method of claim 8, wherein the annealing process is performed in a temperature range of approximately 250 to 450° C.

13. The method of claim 8, wherein a least one of $N_2$ and $H_2$ is used in the annealing process.

14. The method of claim 8, wherein the third passivation layer comprises a silicon oxide-nitride layer.

15. The method of claim 8, wherein the first passivation layer comprises a silicon oxide layer.

16. The method of claim 8, wherein the second passivation layer comprises a silicon nitride layer.

17. The method of claim 8, wherein the first passivation layer comprises a silicon oxide layer, the second passivation layer comprises a silicon nitride layer, and the third passivation layer comprises a silicon oxide-nitride layer.

18. A method comprising:
    forming a first passivation layer on a substrate having first material characteristics;
    forming a second passivation layer on the first passivation layer having second material characteristics; and
    forming a third passivation layer between the first and second passivation layers, the third passivation layer having material characteristics of both the first and second passivation layers,
    wherein the third passivation layer is formed by implanting ions in the second passivation layer and performing an annealing process, wherein said implanting ions and said performing an annealing process are two separate processes.

19. The method of claim 18, wherein the first passivation layer comprises a silicon oxide layer, the second passivation layer comprises a silicon nitride layer, and the third passivation layer comprises a silicon oxide-nitride layer.

* * * * *